(12) United States Patent
Kato et al.

(10) Patent No.: US 6,452,854 B1
(45) Date of Patent: Sep. 17, 2002

(54) CIRCUIT AND METHOD FOR SUPPLYING INTERNAL POWER TO SEMICONDUCTOR MEMORY DEVICE

(75) Inventors: Yoshiharu Kato; Isamu Kobayashi, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/946,561

(22) Filed: Sep. 6, 2001

(30) Foreign Application Priority Data

Sep. 7, 2000 (JP) ........................................ 2000-271819

(51) Int. Cl.[7] ................................................. G11C 7/00
(52) U.S. Cl. ........................ 365/226; 365/222; 365/210
(58) Field of Search .................................. 365/226, 222, 365/210, 207

(56) References Cited

U.S. PATENT DOCUMENTS 5,453,959 A * 9/1995 Sakuta et al. ................ 365/222
5,627,493 A * 5/1997 Takeuchi et al. ............. 365/226

FOREIGN PATENT DOCUMENTS

JP         11-86544         3/1999

* cited by examiner

*Primary Examiner*—Huan Hoang
(74) *Attorney, Agent, or Firm*—Arent Fox Kintner Plotkin & Kahn, PLLC

(57) ABSTRACT

A power supply circuit for supplying a semiconductor memory device with power to perform refreshing. The power supply circuit is connected to an external power supply. The power supply circuit includes a first power supply circuit, which generates a step down voltage by decreasing a first voltage on the external power supply in a normal operation mode, a second power supply circuit, which supplies the internal circuit with a second voltage on the external power supply in a self-refresh mode, and a detection circuit, which detects entry to the self-refresh mode and a voltage level of the external power supply and generates a detection signal based on the detection. During the self-refresh mode, the first power supply circuit receives the second voltage from the external power supply, and the first and second power supply circuits supply the internal circuit with the second voltage based on the detection signal.

15 Claims, 11 Drawing Sheets

CIRCUIT AND METHOD FOR SUPPLYING INTERNAL POWER TO SEMICONDUCTOR MEMORY DEVICE

BACKGROUND OF THE INVENTION

The present invention relates to a semiconductor memory device that requires stored data to undergo a storage holding operation, and more particularly, to an internal power supply circuit of a semiconductor memory device that performs low voltage operations.

The power supply voltage of a semiconductor device is being reduced in recent portable electronic equipment, which use a battery as a power source, to increase usage time. The number of semiconductor memory devices operated by a power supply voltage of 2.5V during normal operations has been increasing.

In a semiconductor memory device that is driven by a low voltage, stored data undergoes a storage holding (refresh) operation with a power supply voltage that is lower than 2.5V, for example 1.5V.

Figure 1:
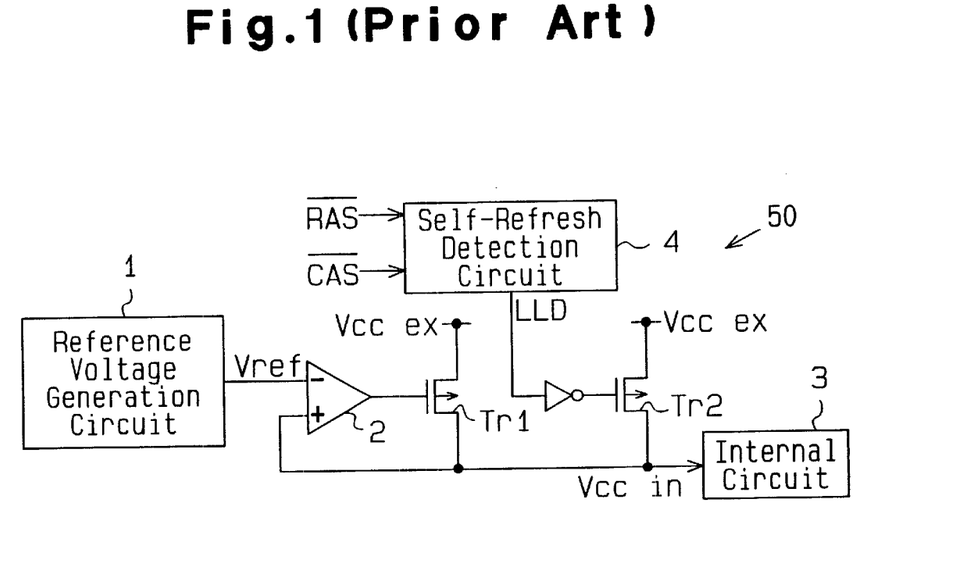
FIG. 1 is a schematic circuit diagram of an internal power supply circuit employed in a semiconductor memory device of a first prior art example.

FIG. 1 schematically shows a first prior art example of a DRAM internal power supply generation circuit 50. Japanese Unexamined Patent Publication No. 11-86544 describes the power supply generation circuit 50.

The voltage of an external power supply Vccex is 2.5V during a normal operation mode and 1.5V during a self-refresh mode.

In the normal operation mode, a differential amplifier 2 generates a transistor drive signal based on the comparison between a reference voltage Vref generated by a reference voltage generation circuit 1 and an internal circuit voltage Vccin. The transistor drive signal activates a p-channel MOS transistor Tr1. The channel resistance of the transistor Tr1 decreases the voltage of the external power supply Vccex. The external power supply Vccex (internal circuit voltage Vccin), the voltage of which has been decreased, supplies an internal circuit 3 with power.

When a self-refresh detection circuit 4 detects a self-refresh mode based on control signals /RAS, /CAS (/represents a low level, active signal), the self-refresh detection circuit 4 generates a detection signal LLD at a high level. This activates a p-channel MOS transistor Tr2 and supplies the internal circuit 3 with power from the external power supply Vccex, which has 1.5V.

During the self-refresh mode in the first prior art example, when the internal circuit 3 is supplied with power having low voltage (1.5V) from the external power supply Vccex, the refresh operation reduces the voltage of the internal circuit voltage Vccin. This may result in erroneous refreshing.

During the self-refresh mode, the transistor Tr2 is constantly activated but the transistor Tr1 is activated only when the voltage of the internal circuit voltage Vccin is lower than the reference voltage Vref.

Figure 2:
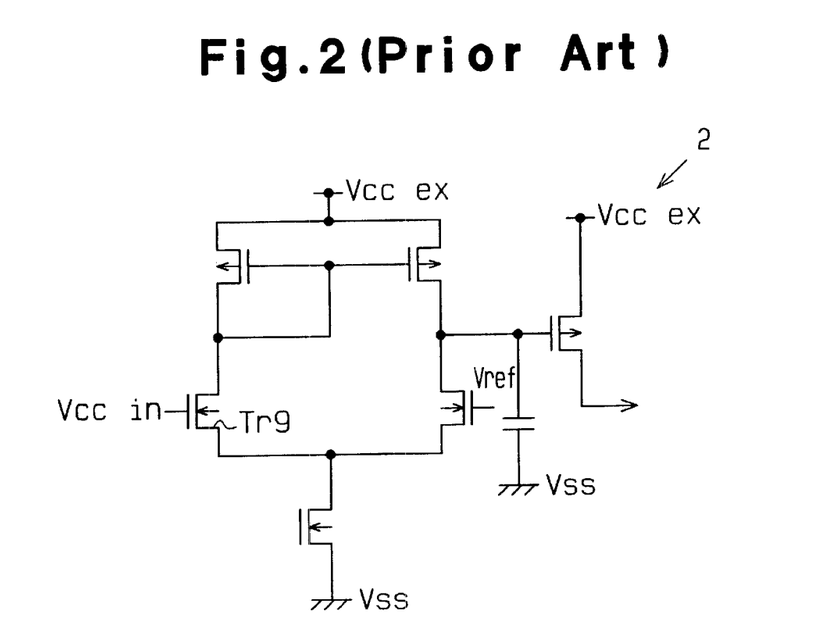
FIG. 2 is a schematic circuit diagram of a differential amplifier employed in the internal power supply circuit of FIG. 1.

FIG. 2 is a circuit diagram of the differential amplifier 2. The voltage of the external power supply Vccex provided to the differential amplifier 2 is 2.5V, the threshold value of a p-channel MOS transistor is 0.9V, and the threshold value of an n-channel MOS transistor is 0.5V. In this case, an n-channel MOS transistor Tr9, which is connected to the internal circuit voltage Vccin, has a drain-source voltage Vds of 1.1V and a gate-source voltage Vgs of 1V.

If the voltage of the external power supply Vccex is 1.5V in the self-refresh mode, the drain-source voltage Vds of the n-channel MOS transistor Tr9 is 0.1V and the gate-source voltage Vgs is 1V.

Figure 3:
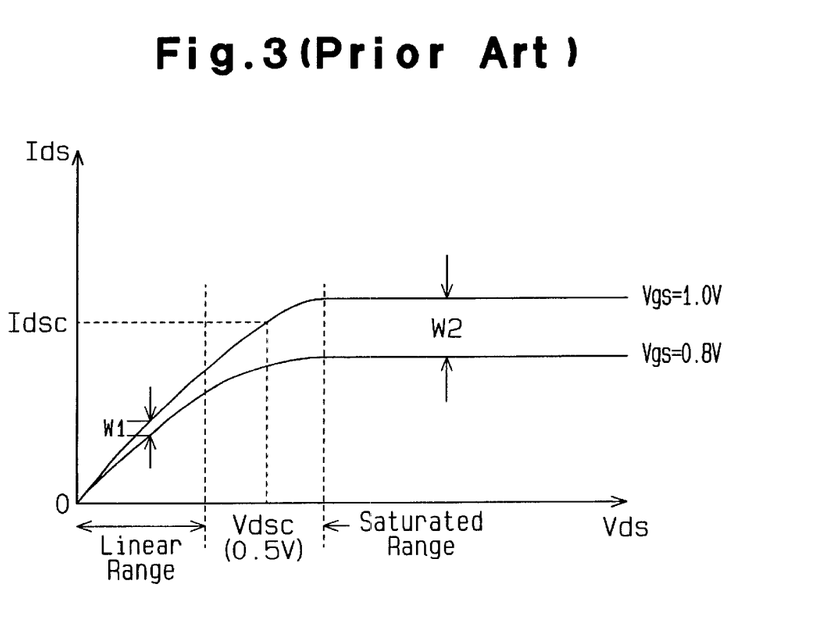
FIG. 3 is a diagram illustrating the characteristic of the differential amplifier of FIG. 2.

Referring to FIG. 3, the transistor Tr9 operates in a saturated range during the normal operation mode and operates in a linear range during the self-refresh mode. Thus, the varying amount W2 of the drain current Ids related to the gate-source voltage Vgs during the normal operation mode is greater compared to the varying amount W1 of the drain current Ids in the self-refresh mode. Thus, the differential amplifier 2 responds slowly to changes in the voltage of the internal circuit voltage Vccin.

As a result, the differential amplifier 2 may not be able to follow a voltage decrease of the internal circuit voltage Vccin. This may result in deficient refreshing or may cause the entire device to stop functioning.

To prevent such deficiency, the transistor Tr2, which is activated during the self-refresh mode, may be enlarged to inhibit a decrease in the voltage of the internal circuit voltage Vccin. However, this would result in a drastic enlargement of the device chip and increase the cost of the device.

Figure 4:
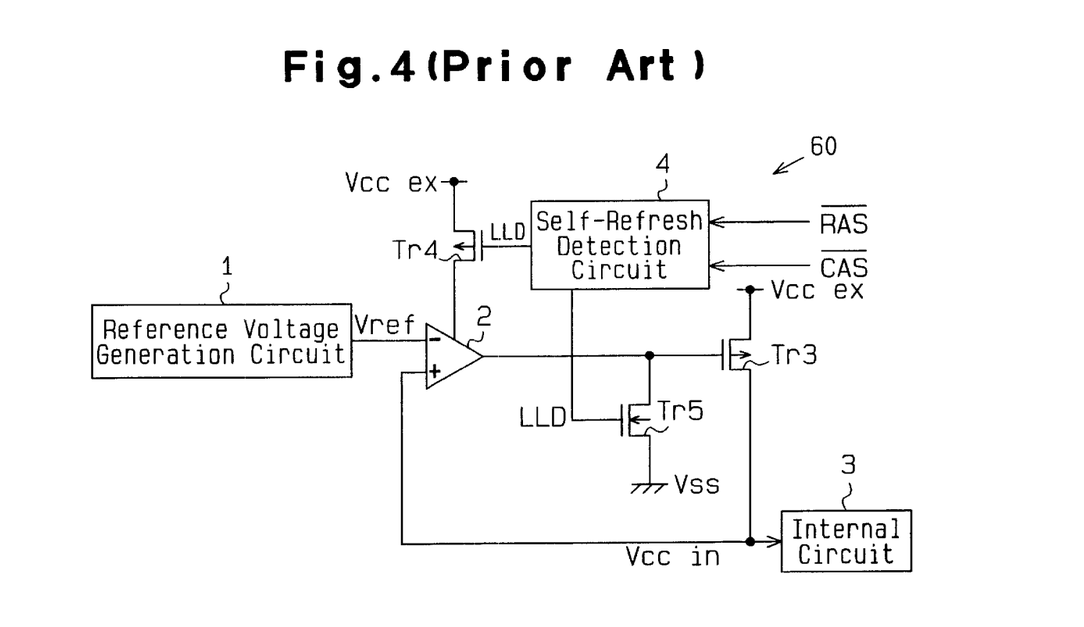
FIG. 4 is a schematic circuit diagram of an internal power supply circuit employed in a semiconductor memory device of a second prior art example.

FIG. 4 is a schematic circuit diagram of a second prior art example of a DRAM internal power supply generation circuit 60. In the second prior art example, a p-channel MOS transistor Tr3 is activated based on an output signal of a differential amplifier 2 in a normal operation mode. The channel resistance of the transistor Tr3 decreases the voltage of an external power supply Vccex. The decreased voltage (voltage of an internal circuit voltage Vccin) is supplied to an internal circuit 3.

During a self-refresh mode, a p-channel MOS transistor Tr4 is inactivated based on a high detection signal LLD, which is provided from a self-refresh detection circuit 4. In this state, the supply of power to the differential amplifier 2 is stopped to inactivate the differential amplifier 2.

The high detection signal LLD activates an n-channel MOS transistor Tr5 and connects the gate of the transistor Tr3 to a power supply Vss (ground). This activates the transistor Tr3 and supplies the internal circuit 3 with the voltage of the external power supply Vccex (the voltage of the internal circuit voltage Vccin), which is 1.5V, via the transistor Tr3.

In the second prior art example, the transistor Tr3 is used in both normal operation and self-refresh modes. During the normal operation mode, if the transistor Tr3 is unnecessarily large, the tailing characteristic of the transistor Tr3 may excessively increase the voltage of the internal circuit voltage Vccin. Further, the power consumption at the internal circuit voltage Vccin may increase. If the transistor Tr3 is designed so that its size is optimal during the normal operation mode, the current supply capacity of the transistor Tr3 may be insufficient during the self-refresh mode thereby causing a refreshing deficiency.

Figure 5:
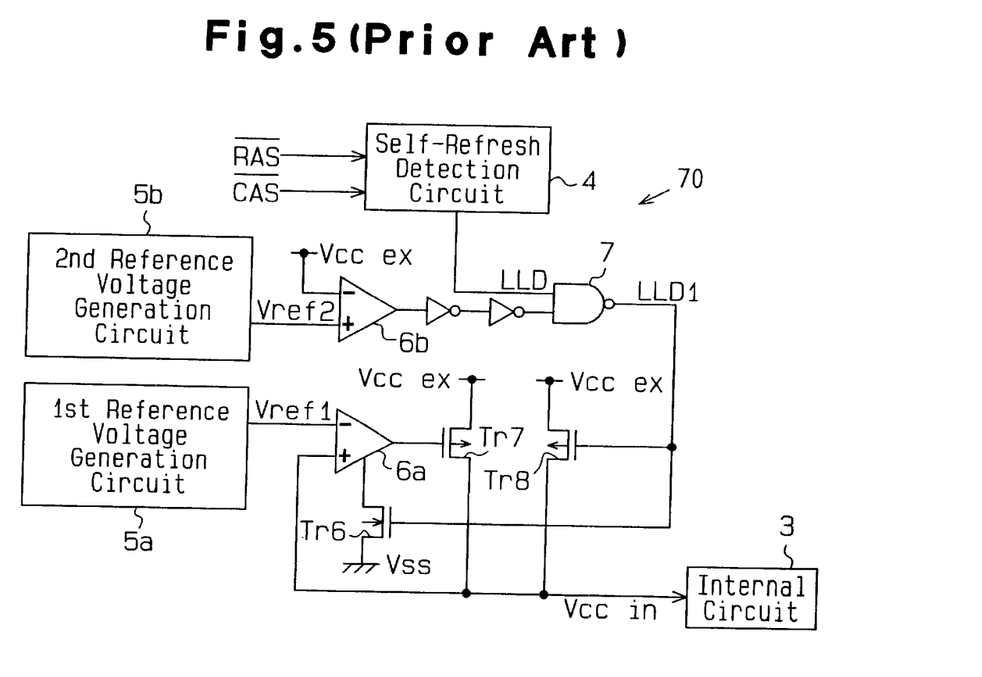
FIG. 5 is a schematic circuit diagram of an internal power supply circuit employed in a semiconductor memory device of a third prior art example.

FIG. 5 is a schematic circuit diagram of a third prior art example of a DRAM internal power supply generation circuit 70. The internal power supply generation circuit 70 includes a first reference voltage generation circuit 5a, which generates a reference voltage Vref1, and a second reference voltage generation circuit 5b, which generates a reference voltage Vref2. The reference voltage Vref2 is lower than the reference voltage Vref1 and functions as a criterion for low voltage operation. The reference voltage Vref1 is supplied to a first differential amplifier 6a, and the reference voltage Vref2 is supplied to a second differential amplifier 6b.

In the normal operation mode, the voltage of the external power supply Vccex is higher than the reference voltage Vref2. Thus, the output signal of the second differential amplifier 6b is low, and the output signal LLD1 of a NAND circuit 7 is high. This activates an n-channel MOS transistor Tr6 and the first differential amplifier 6a and inactivates a p-channel MOS transistor Tr8.

The p-channel MOS transistor Tr7 is activated based on the first differential amplifier 6a. The channel resistance of the transistor Tr7 decreases the voltage of the external power supply Vccex. The decreased voltage is provided to the internal circuit 3.

In the self-refresh mode, the voltage of the external power supply Vccex decreases to a value lower than the reference voltage Vref2. Thus, the output signal of the second differential amplifier 6b goes high. As a result, the output signal LLD1 of the NAND circuit 7 goes low, the transistor Tr6 is inactivated, and the first differential amplifier 6a is inactivated. The NAND output signal LLD1 activates the transistor Tr8, and the voltage of the external power supply Vccex, which is 1.5V, is supplied to the internal circuit 3.

In the third prior art example, power is supplied to the internal circuit 3 based on the operation of the transistor Tr8. Thus, an enlargement of the transistor Tr8 increases the chip size of the semiconductor memory device.

SUMMARY OF THE INVENTION

It is an object of the present invention to provide an internal power supply circuit of a semiconductor memory device that supplies voltage for performing refresh operations without enlarging the chip size of the semiconductor memory device.

To achieve the above object, the present invention provides a power supply circuit for supplying an internal circuit of a semiconductor memory device with power from an external power supply. The power supply circuit includes a first power supply circuit connected to the external power supply and the internal circuit to generate a step down voltage by decreasing a first voltage on the external power supply and to supply the internal circuit with the step down voltage when the semiconductor memory device is in a normal operation mode. A second power supply circuit is connected to the external power supply and the internal circuit to supply the internal circuit with a second voltage on the external power supply when the semiconductor memory device is in a self-refresh mode. A detection circuit is connected to the external power supply and the first and second power supply circuits to detect entry to the self-refresh mode and a voltage level of the external power supply and to generate a detection signal based on the detection of the entry and the voltage level. The first power supply circuit receives the second voltage from the external power supply during the self-refresh mode, and the first and second power supply circuits supply the internal circuit with the second voltage based on the detection signal during the self-refresh mode.

A further perspective of the present invention is a method for supplying an internal circuit of a semiconductor memory device with power from an external power supply. The semiconductor memory device includes a first power supply circuit connected to the external power supply and the internal circuit to generate a step down voltage by decreasing a first voltage on the external power supply and to supply the internal circuit with the step down voltage when the semiconductor memory device is in a normal operation mode. A second power supply circuit is connected to the external power supply and the internal circuit to supply the internal circuit with a second voltage on the external power supply when the semiconductor memory device is in a self-refresh mode. The method includes detecting entry to the self-refresh mode and the supply of the second voltage to the semiconductor memory device, generating a detection signal based on the detection, supplying the internal circuit with the step down voltage from the first power supply circuit based on the detection signal during the normal operation mode, and supplying the internal circuit with the second voltage from the first and second power supply circuits by simultaneously activating the first and second power supply circuits based on the detection signal during the self-refresh mode.

A further perspective of the present invention is a power supply circuit including a first power supply line to receive an external power supply voltage. A second power supply line supplies an internal circuit with an internal power supply voltage. A first transistor is coupled between the first and second power supply lines to supply a step down voltage to the second power supply line in a normal operation mode. A second transistor is coupled between the first and second power supply lines. A detection circuit outputs a detection signal upon a voltage drop on the external power supply voltage during a self refresh mode. The first and second transistor are short-circuited between the first and second power supply lines in response to the detection signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the drawings, like numerals are used for like elements throughout.

Figure 6:
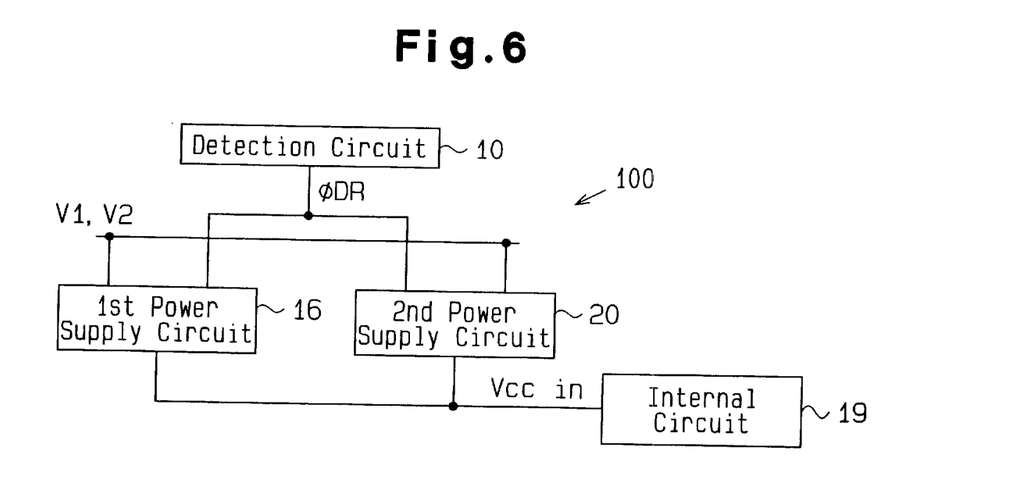
FIG. 6 is a schematic block diagram of an internal power supply circuit employed in a semiconductor memory device according to a first embodiment of the present invention.

FIG. 6 is a schematic block diagram of an internal power supply circuit 100 employed in a semiconductor memory device according to a first embodiment of the present invention.

The internal power supply circuit 100 includes a detection circuit 10, a first power supply circuit 16, and a second power supply circuit 20. The internal power supply circuit 100 is connected to an external power supply Vccex having a first voltage V1 and a second voltage V2, which is lower than the first voltage. The internal power supply circuit 100 is supplied with either the first voltage V1 or the second voltage V2 by, for example, switching the supplied voltage based on a predetermined switch signal.

The first power supply circuit 16 is connected to an external power supply Vccex and an internal circuit 19. When the semiconductor memory device is in a normal operation mode, the first power supply circuit 16 decreases the first voltage V1 to generate a step down voltage Vd and supplies the internal circuit 19 with the step down voltage Vd.

The second power supply circuit 20 is connected to an external power supply Vccex and the internal circuit 19. When the semiconductor memory device is in a self-refresh mode, the second power supply circuit 20 supplies the internal circuit 19 with the second voltage V2.

The detection circuit 10 is connected to the external power supply Vccex and the first and second power supply circuits 16, 20. The detection circuit 10 detects the second voltage V2 and entry to the self-refresh mode to generate a detection signal ØDR based on the detection of the second voltage and entry.

When the semiconductor memory device is in the self-refresh mode, the first power supply circuit 16 receives the second voltage V2 from the external power supply Vccex.

During the self-refresh mode, the first and second power supply circuits 16, 20 supply the internal circuit 19 with the second voltage based on the detection signal.

Accordingly, when the semiconductor memory device is in the self-refresh mode, the capacity for supplying power to the internal circuit 19 increases. This stably supplies the internal circuit with power.

Figure 7:
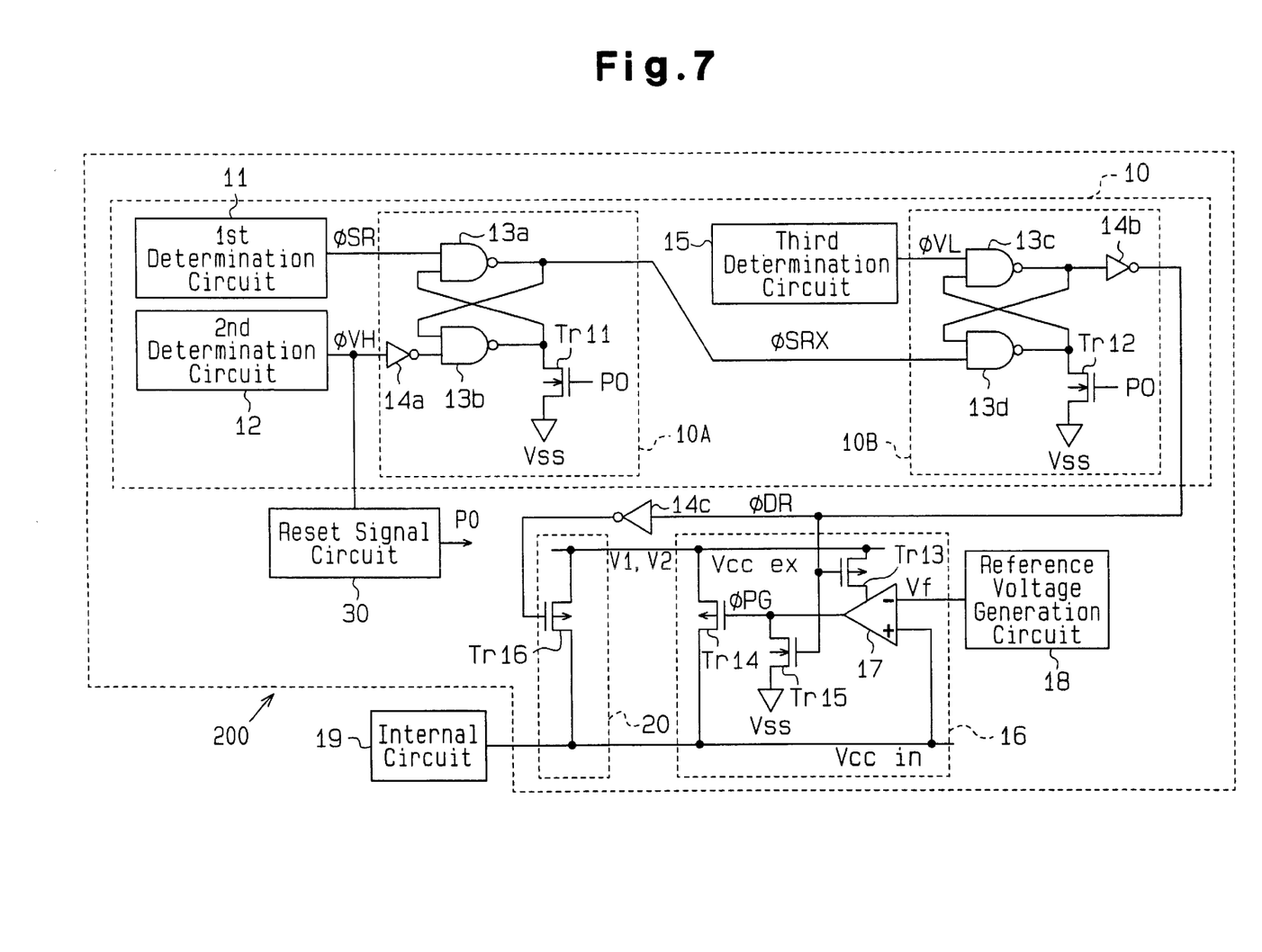
FIG. 7 is a schematic circuit diagram of an internal power supply circuit employed in a semiconductor memory device according to a second embodiment of the present invention.

FIG. 7 is a schematic circuit diagram of an internal power supply circuit 200 employed in a semiconductor memory device according to a second embodiment of the present invention. The internal power supply circuit 200 includes a self-refresh (SR) mode and external power supply detection circuit (hereinafter, simply referred to as detection circuit) 10, a main power supply circuit (first power supply circuit) 16, an auxiliary power supply circuit (second power supply circuit) 20, a reference voltage generation circuit 18, and a reset signal circuit 30. The internal power supply circuit 200 is connected to an external power supply Vccex having a first voltage V1 and a second voltage V2, which is lower than the first voltage V1.

The detection circuit 10 includes a latch circuit 10A, a detection signal generation circuit 10B, a first determination circuit 11, a second determination circuit 12, and a third determination circuit 15. The detection circuit 10 detects entry to the self-refresh mode and the predetermined external power supply voltage V2 to generate a detection signal ØDR.

The first determination circuit 11 determines whether the semiconductor memory device has entered the self-refresh mode. If the device is in the self-refresh mode, the first determination circuit 11 generates a first determination signal ØSR at a high level.

The second determination circuit 12 determines whether the voltage of the external power supply Vccex is 2.5V (first voltage V1) or greater. If the voltage of the external power supply Vccex is 2.5V or greater, the second determination circuit 12 generates a second determination signal ØVH at a high level.

The first latch circuit 10A includes NAND circuits 13a, 13b, an inverter circuit 14a, and an n-channel MOS transistor Tr11.

The first determination signal ØSR is provided to a first input terminal of the NAND circuit 13a. The output signal of the NAND circuit 13a is provided to a first input terminal of the NAND circuit 13b. The second determination signal ØVH is provided to a second input terminal of the NAND circuit 13b via the inverter circuit 14a. The output signal of the NAND circuit 13b is provided to a second input terminal of the NAND circuit 13a.

In the latch circuit 10A, the first determination signal ØSR is low and the second determination signal ØVH is high during the normal operation mode. In this state, an output signal (latch signal) ØSRX of the NAND circuit 13a is held at a high level.

When the first determination signal ØSR goes high during the self-refresh mode, the latch signal ØSRX goes low. When the voltage of the external power supply Vccex becomes lower than 2.5V, the second determination signal ØVH goes low and the output signal of the inverter circuit 14a goes high. Accordingly, the latch signal ØSRX remains low.

The output terminal of the NAND circuit 13b is connected to a power supply Vss via an n-channel MOS transistor Tr11. A reset signal PO is provided to the gate of the transistor Tr11. When the reset signal PO goes high, the latch signal ØSRX is reset to a high level.

The third determination circuit 15 determines whether the voltage of the external power supply Vccex is 1.5V (second voltage V2) or less. When the voltage of the external power supply Vccex is 1.5V or less, the third determination circuit 15 generates the third determination signal ØVL at a high level.

The detection signal generation circuit 10B includes NAND circuits 13c, 13d, an inverter circuit 14b, and an n-channel MOS transistor Tr12.

The third determination signal ØVL is provided to a first input terminal of the NAND circuit 13d. The output signal of the NAND circuit 13c is provided to a first input terminal of the NAND circuit 13d.

The latch signal ØSRX is provided to a second input terminal of the NAND circuit 13d. The output signal of the NAND circuit 13d is provided to a second input terminal of the NAND circuit 13c. The output signal of the NAND circuit 13c is provided to the inverter circuit 14b. The inverter circuit 14b inverts the output signal of the NAND circuit 13c to generate the detection signal ØDR.

In the normal operation mode, the third determination signal ØVL is low and the latch signal ØSRX is high. Accordingly, the output signal of the NAND circuit 13c is latched at a high level and the detection signal ØDR is latched at a low level.

If the operation mode shifts to the self-refresh mode when the voltage of the external power supply Vccex is 2.5V or greater, the latch signal ØSRX goes low. Further, when the voltage of the external power supply Vccex shifts to 1.5V, the input signals of the NAND circuit 13c both go high and latches the detection signal ØDR at a high level.

The output terminal of the NAND circuit 13d is connected to a power supply Vss by a transistor Tr12. The gate of the transistor Tr12 receives the reset signal PO. Accordingly, the transistor Tr12 is activated when the reset signal PO goes high and causes the output signal of the NAND circuit 13c to go high. This resets the detection signal ØDR at a low level.

The detection (data retention) signal ØDR is provided to the main power supply circuit 16.

The main power supply circuit 16 includes a differential amplifier 17, p-channel MOS transistors Tr13, Tr14, and an n-channel MOS transistor Tr15.

The differential amplifier 17 has an inverting input terminal, which receives a reference voltage Vf from the reference voltage generation circuit 18, and a non-inverting input terminal, which receives the voltage of a power supply (internal power supply) Vccin that is supplied to the internal circuit 19. The differential amplifier 17 receives the voltage of the external power supply Vccex via the p-channel MOS transistor Tr13. The gate of the transistor Tr13 is provided with the detection signal ØDR.

The p-channel MOS transistor Tr13 is activated when the detection signal ØDR is low. As a result, the differential amplifier 17 is activated by the external power supply Vccex. When the detection signal ØDR goes high, the transistor Tr13 and the differential amplifier 17 are inactivated.

When the differential amplifier 17 is activated, the differential amplifier 17 amplifies the differential voltage between the reference voltage Vf and the voltage of the internal circuit power supply Vccin to generate an amplification signal ØPG. The amplification signal ØPG is provided to the gate of the p-channel MOS transistor Tr14. The source of the transistor Tr14 is connected to the external power supply Vccex (first power supply line), and the drain of the transistor Tr14 is connected to the internal circuit 19 (second power supply line).

If the differential amplifier 17 is activated, the transistor Tr14 is activated based on the amplification signal ØPG. In this state, the channel resistance of the transistor Tr14 decreases the voltage of the external power supply Vccex (first voltage V1) and generates a step down voltage Vd. The step down voltage Vd is provided to the internal circuit 19.

The gate of the transistor Tr14 is connected to the drain of the n-channel MOS transistor Tr15. When the transistor Tr15 is activated, the gate of the transistor Tr14 is connected to the power supply Vss. The gate of the transistor Tr15 receives the detection signal ØDR. Accordingly, if the detection signal ØDR is high, the transistor Tr15 is activated and voltage at the power supply Vss level (ground level) is applied to the gate of the transistor Tr14. In this state, the channel resistance of the transistor Tr14 is decreased. Thus, the internal circuit 19 is substantially supplied with the voltage of the external power supply Vccex (second voltage V2).

The auxiliary power supply circuit 20 includes a p-channel MOS transistor Tr16. The detection signal ØDR is provided to the gate of the p-channel MOS transistor Tr16 via the inverter circuit 14c. The source of the transistor Tr16 is connected to the external power supply Vccex (first power supply line). The drain of the transistor Tr16 is connected to the internal circuit 19 (second power supply line).

Accordingly, when the detection signal ØDR is high, the transistor Tr16 is activated and the internal circuit 19 is supplied with the voltage of the external power supply Vccex (second voltage V2). When the semiconductor memory device is undergoing data retention, the transistor Tr16 functions as an auxiliary power supply circuit of the transistor Tr14.

Figure 9:
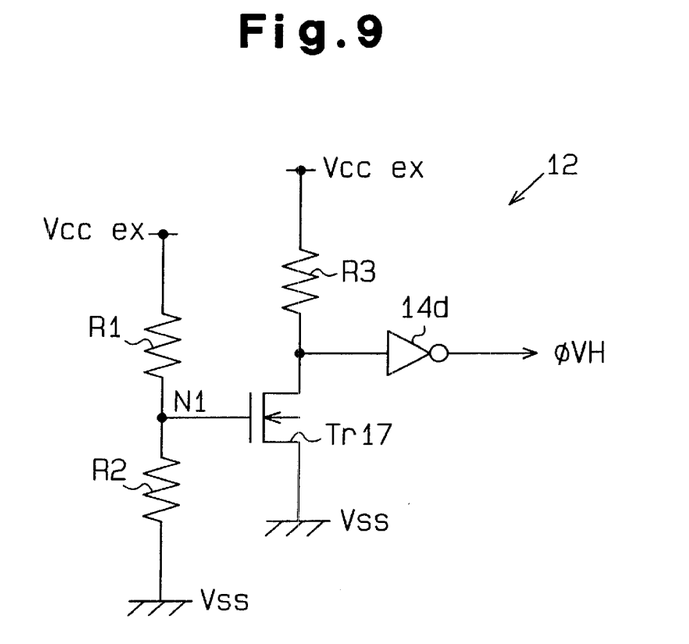
FIG. 9 is a schematic circuit diagram of a second determination circuit employed in the internal power supply circuit of FIG. 7.

The second determination circuit 12 will now be discussed with reference to FIG. 9. The second determination circuit 12 includes resistors R1, R2, R3, an inverter circuit 14d, and an n-channel MOS transistor Tr17.

The resistors R1, R2 are connected in series between the external power supply Vccex and the power supply Vss. The gate of the transistor Tr17 is connected to node N1 between the resistors R1, R2. The drain of the transistor Tr17 is connected to the external power supply Vccex via the resistor R3. The source of the transistor Tr17 is connected to the power supply Vss. The drain potential of the transistor Tr17 is provided to the input terminal of the inverter circuit 14d. The second determination signal ØVH is output from the inverter circuit 14d.

Figure 11:
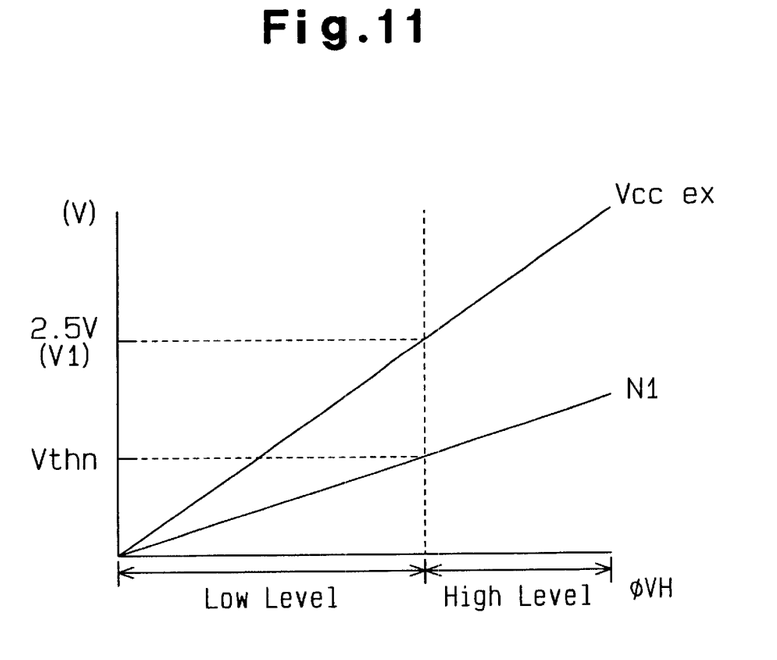
FIG. 11 is a diagram illustrating the operational characteristic of the second determination circuit of FIG. 9.

In the second determination circuit 12, the potential at node N1 varies in proportion to the change in the voltage of the external power supply Vccex, as shown in FIG. 11. The resistances of the resistors R1, R2 are set so that the potential at node N1 reaches the threshold value Vthn of the transistor Tr17 when the voltage of the external power supply Vccex reaches 2.5V (first voltage V1). Accordingly, the second determination circuit 12 generates the second determination signal ØVH at a high level when the voltage of the external power supply Vccex is 2.5V or greater.

Figure 10:
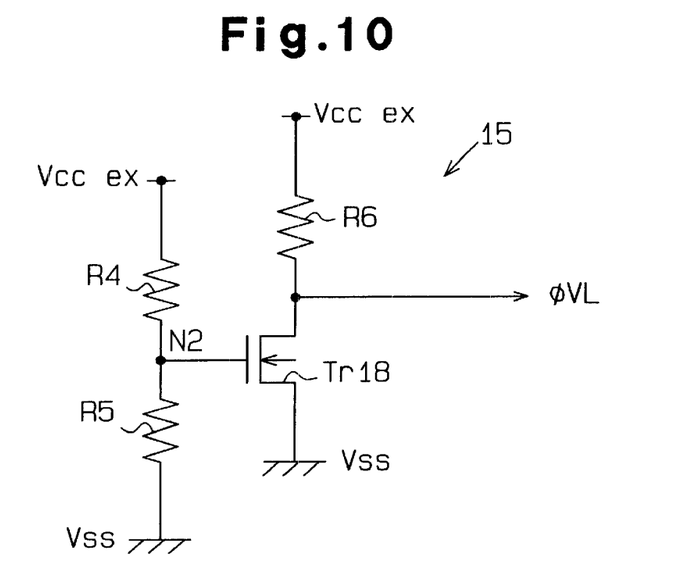
FIG. 10 is a schematic circuit diagram of a third determination circuit employed in the internal power supply circuit of FIG. 7.

The third determination circuit 15 will now be discussed with reference to FIG. 10. The third determination circuit 15 includes resistors R4, R5, R6 and an n-channel MOS transistor Tr18.

The resistors R4, R5 are connected in series between the external power supply Vccex and the power supply Vss. The gate of the transistor Tr18 is connected to node N2 between the resistors R4, R5. The drain of the transistor Tr18 is connected to the external power supply Vccex via the resistor R6. The source of the transistor Tr18 is connected to the power supply Vss. The third determination signal ØVL is output from the drain of the transistor Tr18.

Figure 12:
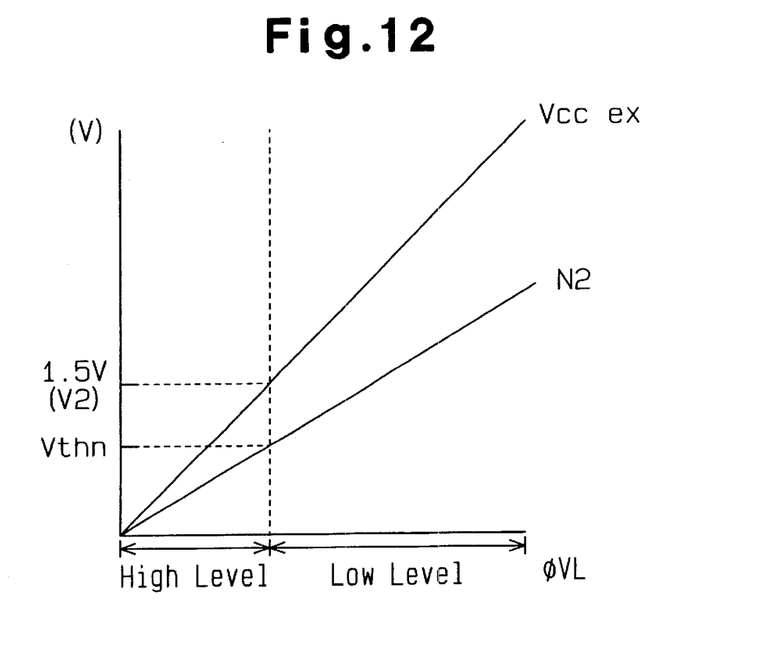
FIG. 12 is a diagram illustrating the operational characteristic of the third determination circuit of FIG. 10.

In the third determination circuit 15, the potential at node N2 varies in proportion to the change in the voltage of the external power supply Vccex, as shown in FIG. 12. The resistances of the resistors R4, R5 are set so that the potential at node N2 reaches the threshold value Vthn of the transistor Tr18 when the voltage of the external power supply Vccex reaches 1.5V (second voltage V2). Accordingly, the third determination circuit 15 generates the third determination signal ØVL at a high level when the voltage of the external power supply Vccex is 1.5V or less.

Figure 13:
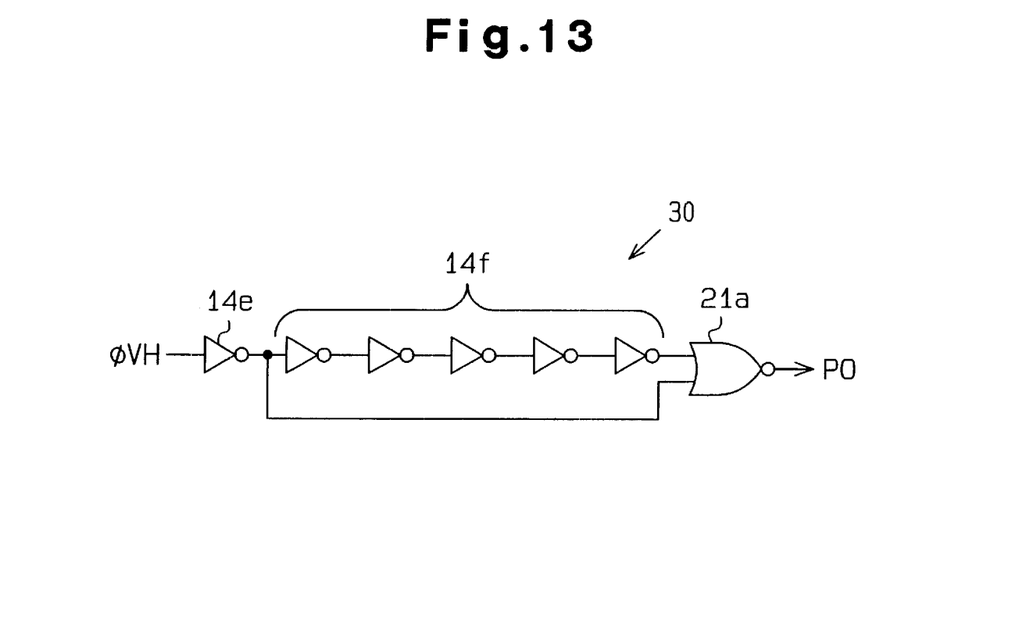
FIG. 13 is a schematic circuit diagram of a reset signal generation circuit.

The reset signal circuit 30, which generates the reset signal PO, will now be discussed with reference to FIG. 13. The reset signal circuit 30 includes an inverter circuit 14e, an odd number (in the second embodiment, five) of inverter circuits 14f, and a NOR circuit 21a.

The inverter circuit 14e receives and inverts the second determination signal ØVH. The inverted second determination signal ØVH is provided to a first input terminal of the NOR circuit 21a. Further, the inverted second determination signal ØVH is provided to a second input terminal of the NOR circuit 21a Via the inverter circuit 14f. The NOR circuit 21a outputs the reset signal PO.

The reset signal circuit 30 generates a reset signal (one shot pulse signal) having a pulse width corresponding to the operation delay time of the inverter circuit 14f when the second determination signal ØVH goes high.

Figure 8:
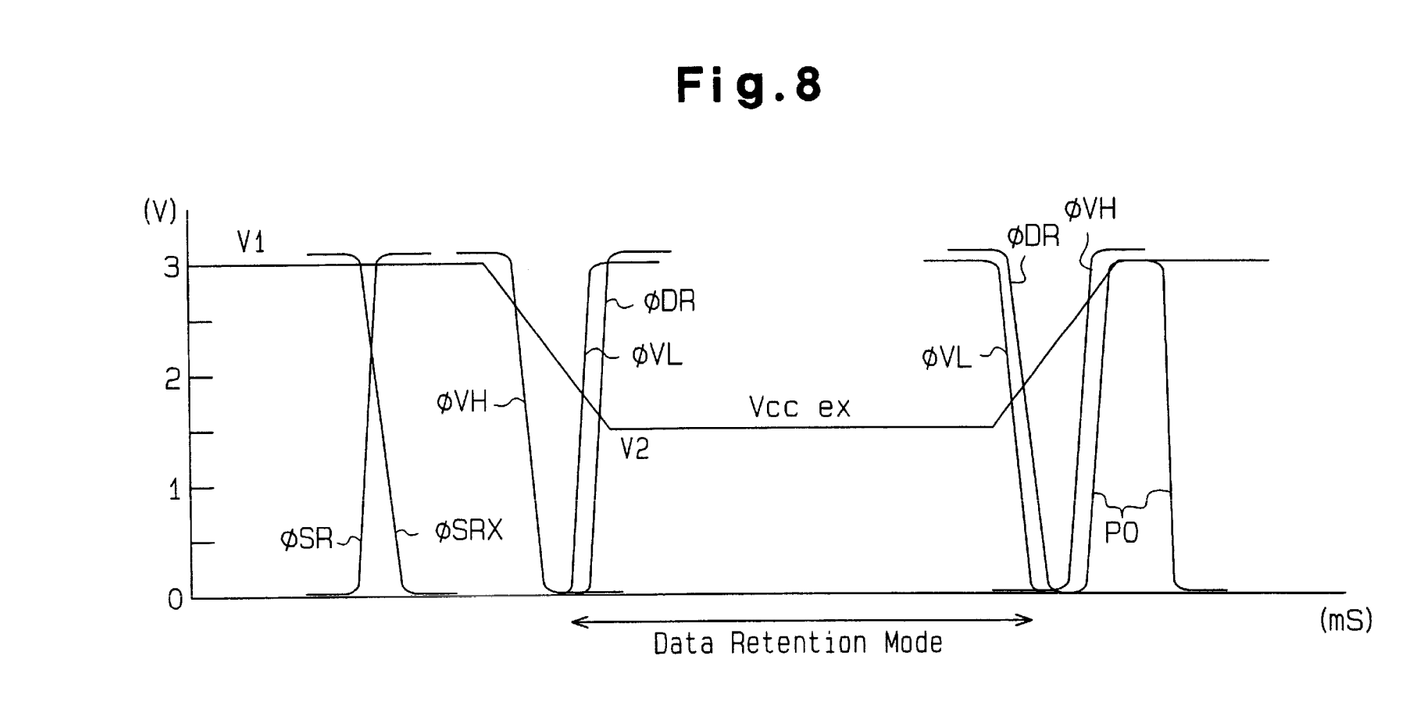
FIG. 8 is a timing-waveform chart illustrating the operation of the internal power supply circuit of FIG. 7.

The operation of the internal power supply circuit 200 will now be discussed with reference to FIG. 8.

In the normal operation mode, the first determination signal ØSR is low, the second determination signal ØVH is high, and the latch signal ØSRX is high. In this state, the third determination signal ØVL is low. Thus, the detection signal ØDR is low.

The low detection signal ØDR activates the transistor Tr13 of the main power supply circuit 16, which in turn, activates the differential amplifier 17. The amplification signal ØPG of the differential amplifier 17 activates the transistor Tr14. In this state, the internal circuit 19 is supplied with the step down voltage Vd. The transistor Tr16 of the auxiliary power supply circuit 20 is inactivated by the high detection signal ØDR inverted by the inverter circuit 14c.

When the semiconductor memory device enters the self-fresh mode, the first determination signal ØSR goes high and the latch signal ØSRX goes low. The semiconductor memory device then undergoes data retention. When the external power supply Vccex decreases to 1.5V or less, the third determination signal ØVL goes high. This causes the detection signal ØDR to go high.

The high detection signal ØDR inactivates the transistor Tr13 of the main power supply circuit 16, which in turn, inactivates the differential amplifier 17. Further, the transistor Tr15 is activated and the gate of the transistor Tr14 is connected to the power supply Vss. Thus, the transistor Tr14 is completely activated, and the internal circuit 19 is supplied with a voltage of 1.5V (second voltage V2).

The transistor Tr16 of the auxiliary power supply circuit 20 is activated by the low detection signal ØDR inverted by the inverter circuit 14c. Thus, the internal circuit 19 is supplied with a voltage of 1.5V (second voltage V2) via the transistor Tr16. Accordingly, when the semiconductor memory device is undergoing data retention, the internal circuit 19 is supplied with sufficient current via the transistors Tr14, Tr16.

After data retention is completed, when the voltage of the external power supply Vccex exceeds 1.5V, the third determination signal ØVL and the detection signal ØDR both go low. This activates the differential amplifier 17 in the main power supply circuit 16. Further, the transistor Tr15 is deactivated, and the transistor Tr14 is driven by the differential amplifier 17. The transistor Tr16 of the auxiliary power supply circuit 20 is inactivated.

Then, when the voltage of the external power supply Vccex exceeds 2.5V, the reset signal PO goes high for a predetermined time, the latch signal ØSRX goes high, and the detection signal ØDR goes low.

The internal power supply circuit 200 of the second embodiment has the advantages described below.

(1) When the semiconductor memory device is in the self-refresh mode, the external power supply Vccex supplies the internal circuit 19 with a voltage of 1.5V (second voltage V2) via the transistor Tr14 of the main power supply circuit 16 and the transistor Tr16 of the auxiliary power supply circuit 20. In the self-refresh mode, this improves the capability for supplying power to the internal circuit 19 and supplies the internal circuit 19 with stable power.

(2) Sufficient current is supplied to the internal circuit 19 during the self-refresh mode without enlarging the transistor Tr14. Further, the transistor Tr16 may be smaller than the transistor Tr14. Accordingly, the semiconductor memory device chip is not enlarged.

(3) The detection circuit 10 separately determines entry to the self-refresh mode and a voltage change of the external power supply Vccex (voltage decrease) to detect whether data retention is being performed. Accordingly, the transistors Tr14, Tr16 are driven in parallel when detecting data retention.

Figure 14:
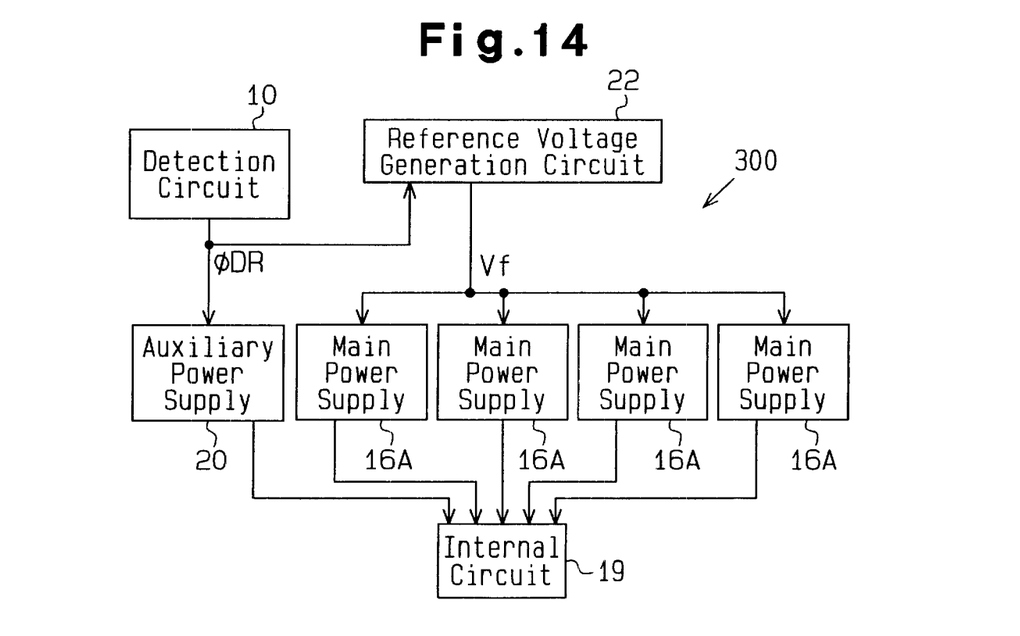
FIG. 14 is a schematic block diagram of an internal power supply circuit employed in a semiconductor memory device according to a third embodiment of the present invention.

FIG. 14 is a schematic block diagram of an internal power supply circuit 300 according to a third embodiment of the present invention. The internal power supply circuit 300 includes a plurality of main power supply circuits 16A. The main power supply circuits 16A are scattered along a semiconductor chip. In the internal power supply circuit 300, a detection signal ØDR is provided to an auxiliary power supply circuit 20 and a reference voltage generation circuit 22 but nor provided to the main power supply circuits 16A.

Upon receipt of a low detection signal ØDR, the reference voltage generation circuit 22 provides each power supply circuit 16A with a predetermined reference voltage Vf. Further, upon receipt of a high detection signal ØDR, the reference voltage generation circuit 22 provides each main power supply circuit 16A with a predetermined reference voltage Vf, which has a high level.

Figure 15:
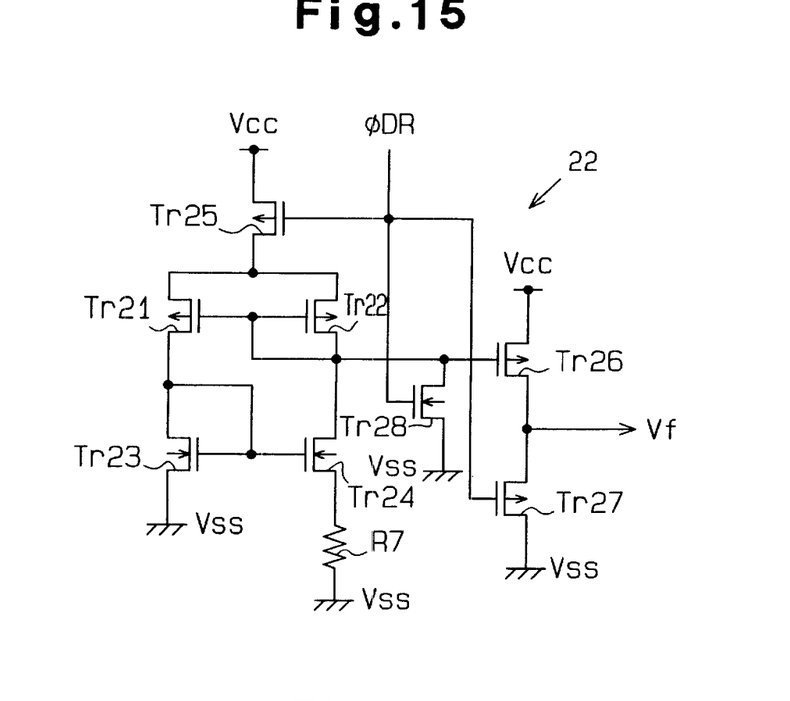
FIG. 15 is a circuit diagram of a reference voltage generation circuit of the internal power supply circuit of FIG. 14.

FIG. 15 is a circuit diagram of the reference voltage generation circuit 22. The reference voltage generation circuit 22 includes five p-channel MOS transistors Tr21, Tr22, Tr25, Tr26, Tr27, and three n-channel MOS transistors Tr23, Tr24, Tr28, and a resistor R7.

The transistors Tr21, Tr22, Tr23, Tr24 and the resistor R7 form a current mirror circuit. The transistor Tr25 supplies the current mirror circuit with current.

The drains of the transistors Tr22, Tr24 are connected to the gate of the p-channel MOS transistor Tr26. The source of the transistor Tr26 is connected to power supply Vcc. The drain of the transistor Tr26 is connected to power supply Vss via the p-channel MOS transistor p-channel MOS transistor Tr27. The gate of the transistor Tr26 is connected to the power supply Vss via the n-channel MOS transistor Tr28.

The gates of the transistors Tr25, Tr27, Tr28 receive the detection signal ØDR. During the self-refresh mode, the power supply Vcc has a voltage that is higher than the decreased voltage of the external power supply Vccex (e.g., 1.5V).

When the reference voltage generation circuit 22 receives the detection signal ØDR at a low level, the transistors Tr25, Tr27 are activated and the transistor Tr28 is inactivated. This activates the current mirror circuit and the transistor Tr26. In this state, the reference voltage generation circuit 22 generates a reference voltage Vf (first reference voltage) in correspondence with the ratio of the channel resistances between the transistors Tr26, Tr27.

When the reference voltage generation circuit 22 receives the detection signal ØDR at a high level, the transistors Tr25, Tr27 are inactivated and the transistor Tr28 is activated. In this state, the reference voltage generation circuit 22 outputs reference voltage Vf (second reference voltage), which is equal to the voltage of the power supply Vcc.

When the voltage of the power supply Vcc, which is the reference voltage Vf, is supplied to a differential amplifier 17 of each main power supply circuit 16A, the voltage of an amplification signal ØPG decreases to a value close to the level of the power supply Vss. In this state, the channel resistance of the transistor Tr14 decreases and the voltage V2 of the external power supply Vccex is substantially supplied to an internal circuit.

The internal power supply circuit 300 of the third embodiment has the advantages described below.

(1) In the self-refresh mode, the reference voltage Vf supplied from the reference voltage generation circuit 22 is fixed at the voltage of the power supply Vcc (high level) based on the detection signal ØDR. Thus, the transistor Tr14 of each main power supply circuit 16A is completely activated, and the transistor Tr14 supplies the internal circuit 19 with the voltage of the external power supply Vccex together with the transistor Tr16 of the auxiliary power supply circuit 20. Accordingly, in the self-refresh mode, the capability for supplying power to the internal circuit 19 is improved and the internal circuit 19 is supplied with stable power.

(2) Lines for providing the detection signal ØDR to the main power supply circuits 16A is not necessary. This reduces the chip size of the memory device.

Figure 16:
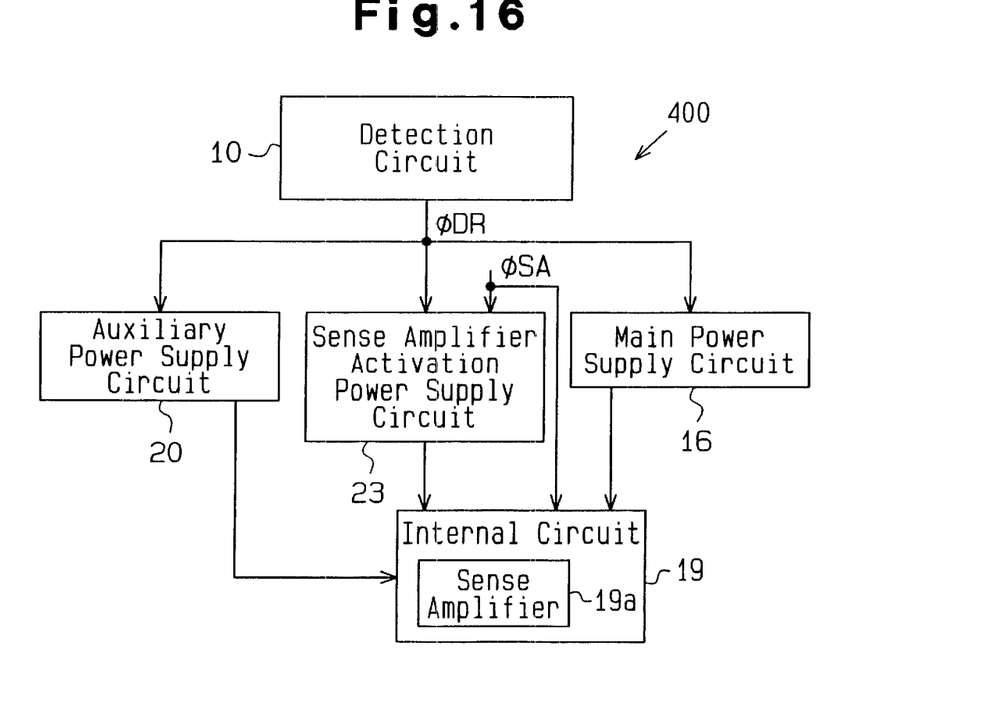
FIG. 16 is a schematic block diagram of an internal power supply circuit employed in a semiconductor memory device according to a fourth embodiment of the present invention.

FIG. 16 is a schematic block diagram of an internal power supply circuit 400 employed in a semiconductor memory device according to a fourth embodiment of the present invention.

The internal power supply circuit 400 includes a sense amplifier (SA) activation power supply circuit 23 in addition to the configuration of the internal power supply circuit 200 of FIG. 7. In the internal power supply circuit 400, the detection signal ØDR is provided to the SA activation power supply circuit 23 in addition to the main power supply circuit 16 and the auxiliary power supply circuit 20. The internal circuit 19 includes a sense amplifier 19a for amplifying a read signal of data stored in the semiconductor memory device.

The SA activation power supply circuit 23 is used to suppress a decrease in the voltage of the internal circuit voltage Vccin that is caused by a peak current. The peak current flows when a plurality of sense amplifiers 19a are simultaneously activated in a DRAM.

Figure 17:
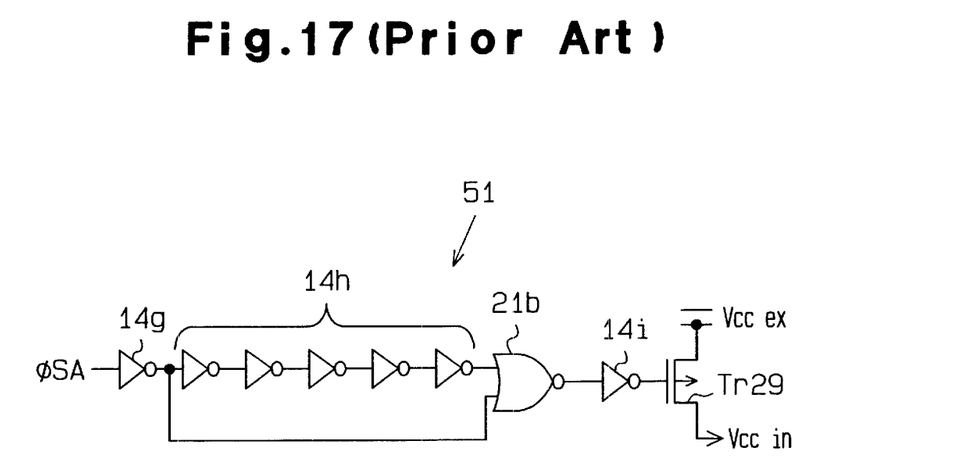
FIG. 17 is a schematic circuit diagram of a sense amplifier activation power supply circuit that is known in the prior art.

FIG. 17 is a schematic circuit diagram of a prior art SA activation power supply circuit 51.

The inverter circuit 14g receives and inverts an activation signal ØSA, which activates the sense amplifiers. The inverted activation signal ØSA is provided to a first input terminal of a NOR circuit 21b. The inverted activation signal ØSA is also provided to a second input terminal of the NOR circuit 21b via an odd number (in FIG. 17, five) of inverter circuits 14h.

The output signal of the NOR circuit 21b is provided to the gate of a p-channel MOS transistor Tr29 via an inverter circuit 14i. The source of the transistor Tr29 is connected to the external power supply Vccex, and the drain of the transistor Tr29 is connected to an internal circuit.

In the conventional SA activation power supply circuit 51, when the activation signal ØSA goes high, the inverter circuit 14i provides the gate of the transistor Tr29 with a low pulse signal for a predetermined time to activate the transistor Tr29 for the predetermined time. The predetermined time corresponds to the delay time of the inverter circuit 14h.

Accordingly, when a plurality of sense amplifiers are simultaneously activated, the transistor Tr29 is activated for a predetermined time and the internal circuit is supplied with power from the external power supply Vccex. Thus, the internal circuit voltage Vccin is not decreased and remains the same.

Figure 18:
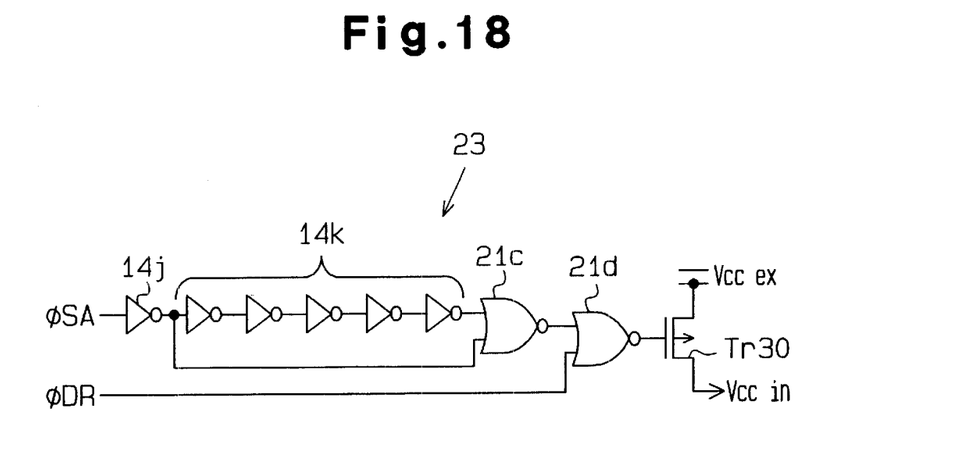
FIG. 18 is a schematic circuit diagram of a sense amplifier activation power supply circuit of the internal power supply circuit of FIG. 16.

FIG. 18 is a schematic circuit diagram of the SA activation power supply circuit 23 of the fourth embodiment.

The inverter circuit 14j receives and inverts the sense amplifier activation signal ØSA. The inverted activation signal ØSA is provided to a first input terminal of a NOR circuit 21c. The inverted activation signal ØSA is also provided to a second input terminal of the NOR circuit 21c via an odd number (in FIG. 18, five) of inverter circuits 14k.

The output signal of the NOR circuit 21c is provided to a first input terminal of a NOR circuit 21d. A second input terminal of the NOR circuit 21d is provided with a detection signal ØDR. The output signal of the NOR circuit 21d is provided to the gate of a p-channel MOS transistor Tr30. The source of the transistor Tr30 is connected to an external power supply Vccex. The drain of the transistor Tr30 is connected to an internal circuit.

In the SA activation power supply circuit 23, when the sense amplifier activation signal ØSA goes high, the NOR circuit 21d provides the gate of the transistor Tr30 with a pulse signal that is held at a low level for a predetermined time. The transistor Tr30 is activated for a predetermined time. The predetermined time corresponds to the delay time of the inverter circuit 14k.

Accordingly, when a plurality of sense amplifiers are simultaneously activated, the transistor Tr30 is activated for a predetermined time and the voltage of the external power supply Vccex is provided to the internal circuit 19. Thus, the voltage of the internal circuit is not decreased.

Further, the transistor Tr30 is activated when the second input terminal of the NOR circuit 21d is provided with the high detection signal ØDR. Accordingly, the internal circuit 19 is supplied with the voltage V2 of the external power supply Vccex via the SA activation power supply circuit 23 when data retention is performed during the self-refresh mode.

The internal power supply circuit 400 of the fourth embodiment has the advantages described below.

(1) In the self-refresh mode, the voltage of the external power supply Vccex is supplied to the internal circuit 19 using the SA activation power supply circuit 23 in addition to the main power supply circuit 16 and the auxiliary power supply circuit 20. Accordingly, during the self-refresh mode, the capability for supplying the internal circuit 19 with power is increased, and the internal circuit 19 is supplied with stable power.

(2) The capability for supplying the internal circuit 19 with power is increased. Thus, the size of the transistor Tr16 of the auxiliary power supply circuit 20 is decreased. This decreases the chip size of the memory device.

Figure 19:
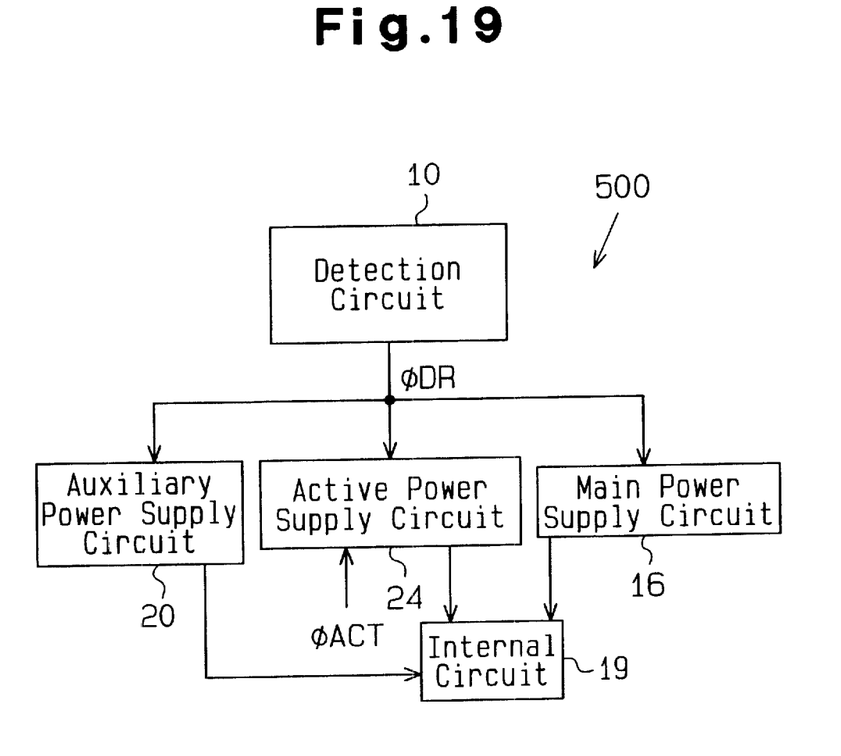
FIG. 19 is a schematic block diagram of an internal power supply circuit employed in a semiconductor memory device according to a fifth embodiment of the present invention.

FIG. 19 is a schematic block diagram of an internal power supply circuit 500 employed in a semiconductor memory device according to a fifth embodiment of the present invention.

In addition to the configuration of the internal power supply circuit 100 shown in FIG. 7, the internal power supply circuit 500 includes an active power supply circuit 24. The active power supply circuit 24 has a configuration similar to that of the main power supply circuit 16 of FIG. 7. In the internal power supply circuit 500, the detection signal ØDR is provided to the main power supply circuit 16, the auxiliary power supply circuit 20, and the active power supply circuit 24.

When the internal circuit 19 is activated, the active power supply circuit 24 is activated by an activation signal ØACT. When the internal circuit 19 is in a standby state, the active power supply circuit 24 is inactivated, and the main power supply circuit 16 supplies the internal circuit 19 with the minimum step-down voltage Vd. This decreases the power consumption of the memory device.

In addition to the main power supply circuit 16 and the auxiliary power supply circuit 20, the active power supply circuit 24 supplies the internal circuit 19 with the voltage of the external power supply Vccex during the self-refresh mode.

The internal power supply circuit 500 of the fifth embodiment has the advantages described below.

(1) In addition to the main power supply circuit 16 and the auxiliary power supply circuit 20, the active power supply circuit 24 is used to supply the internal circuit 19 with the voltage of the external power supply Vccex during the self-refresh mode. Accordingly, in the self-refresh mode, the capability for supplying power to the internal circuit 19 is increased, and the internal circuit 19 is supplied with stable power.

(2) The capability for supplying the internal circuit 19 with power is increased. Thus, the size of the transistor Tr16 of the auxiliary power supply circuit 20 is decreased. This decreases the chip size of the memory device.

It should be apparent to those skilled in the art that the present invention may be embodied in many other specific forms without departing from the spirit or scope of the invention. Particularly, it should be understood that the present invention may be embodied in the following forms.

The internal power supply circuit 400 of the fourth embodiment may further include the configuration of the active power supply circuit 24 of the fifth embodiment.

The auxiliary power supply circuit 20 may be omitted from the internal power supply circuit 400 of the fourth embodiment.

The auxiliary power supply circuit 20 may be omitted from the internal power supply circuit 500 of the fifth embodiment.

The present examples and embodiments are to be considered as illustrative and not restrictive, and the invention is not to be limited to the details given herein, but may be modified within the scope and equivalence of the appended claims.

What is claimed is:

1. A power supply circuit for supplying an internal circuit of a semiconductor memory device with power from an external power supply, the power supply circuit comprising:

a first power supply circuit connected to the external power supply and the internal circuit for generating a step down voltage by decreasing a first voltage on the external power supply and supplying the internal circuit with the step down voltage when the semiconductor memory device is in a normal operation mode;

a second power supply circuit connected to the external power supply and the internal circuit for supplying the internal circuit with a second voltage on the external power supply when the semiconductor memory device is in a self-refresh mode;

a detection circuit connected to the external power supply and the first and second power supply circuits for detecting entry to the self-refresh mode and a voltage level of the external power supply and generating a detection signal based on the detection of the entry and the voltage level, wherein the first power supply circuit receives the second voltage from the external power supply during the self-refresh mode, and the first and second power supply circuits supply the internal circuit with the second voltage based on the detection signal during the self-refresh mode.

2. The power supply circuit according to claim 1, wherein the detection circuit includes:

a first determination circuit for determining whether the semiconductor memory device has entered the self-refresh mode and generating a first determination signal that indicates the determination;

a second determination circuit for determining whether the first voltage is being supplied during the normal operation mode and generating a second determination signal that indicates the determination;

a third determination circuit for determining whether the second voltage is being supplied during the self-refresh mode and generating a third determination signal that indicates the determination; and a detection signal generation circuit connected to the first, second, and third determination circuits to generate the detection signal based on the first, second, and third determination signals.

3. The power supply circuit according to claim 2, wherein the first power supply circuit includes:

a first transistor connected between the external power supply and the internal circuit to provide the internal circuit with power from the external power supply based on the detection signal, wherein the first transistor is activated during the normal operation mode to produce a predetermined channel resistance and activated during the self-refresh mode with lower channel resistance.

4. The power supply circuit according to claim 3, wherein the second power supply circuit includes a second transistor for providing the internal circuit with the second voltage based on the detection signal.

5. The power supply circuit according to claim 4, further comprising:

a reference voltage generation circuit connected to the first power supply circuit for generating a reference voltage, wherein the first power supply circuit includes;

a differential amplifier connected to the first transistor for receiving the reference voltage from the reference voltage generation circuit and generating an amplification signal by amplifying a differential voltage between the reference voltage and a power supply voltage supplied to the internal circuit, wherein the differential amplifier drives the first transistor with the amplification signal during the normal operation mode and is inactivated by the detection signal during the self-refresh mode.

6. The power supply circuit according to claim 5, wherein the first power supply circuit further includes:

a conductive circuit connected to the first transistor for activating the first transistor based on the detection signal during the self-refresh mode.

7. The power supply circuit according to claim 3, further comprising:

a reference voltage generation circuit connected to the detection circuit and the first power supply circuit for generating a first reference voltage based on the detection signal, wherein the reference voltage generation circuit generates a second reference voltage, which is higher than the first reference voltage, during the self-refresh mode, and wherein the first power supply circuit includes;

a differential amplifier connected to the first transistor for receiving the first reference voltage from the reference voltage generation circuit, generating a first amplification signal by amplifying a differential voltage between the first reference voltage and a power supply voltage supplied to the internal circuit, receiving the second reference voltage from the reference voltage generation circuit, and generating a second amplification signal by amplifying a differential voltage between the second reference voltage and the power supply voltage supplied to the internal circuit, the differential amplifier driving the first transistor based on the first amplification signal during the normal operation mode and driving the first transistor based on the second amplification signal during the self-refresh mode.

8. The power supply circuit according to claim 1, wherein the internal circuit includes a sense amplifier for amplifying a read signal of data stored in the semiconductor memory device, the power supply circuit further comprising:

a sense amplifier activation power supply circuit connected to the detection circuit and the internal circuit for supplying the sense amplifier with current based on an activation signal that activates the sense amplifier, wherein the sense amplifier activation circuit supplies the internal circuit with the second voltage based on the detection signal during the self-refresh mode.

9. The power supply circuit according to claim 8, further comprising:

an activating power supply circuit connected to the detection circuit for supplying the internal circuit with the second voltage based on the detection signal and a device activation signal, which activates the semiconductor memory device, during the self-refresh mode.

10. The power supply circuit according to claim 1, further comprising:

an activating power supply circuit connected to the detection circuit for supplying the internal circuit with the second voltage based on the detection signal and a device activation signal, which activates the semiconductor memory device, during the self-refresh mode.

11. A method for supplying an internal circuit of a semiconductor memory device with power from an external power supply, wherein the semiconductor memory device includes a first power supply circuit connected to the external power supply and the internal circuit for generating a step down voltage by decreasing a first voltage on the external power supply and supplying the internal circuit with the step down voltage when the semiconductor memory device is in a normal operation mode, and a second power supply circuit connected to the external power supply and the internal circuit for supplying the internal circuit with a second voltage on the external power supply when the semiconductor memory device is in a self-refresh mode, the method comprising the steps of:

detecting entry to the self-refresh mode and the supply of the second voltage to the semiconductor memory device;

generating a detection signal based on the detection;

supplying the internal circuit with the step down voltage from the first power supply circuit based on the detection signal during the normal operation mode; and supplying the internal circuit with the second voltage from the first and second power supply circuits by simultaneously activating the first and second power supply circuits based on the detection signal during the self-refresh mode.

12. The method according to claim 11, wherein the detecting step includes:

a first determining step for determining whether the semiconductor memory device has entered the self-refresh mode;

a second determining step for determining whether the semiconductor memory device is being supplied with the first voltage during the normal operation mode; and a third determination step for determining whether the semiconductor memory device is being supplied with the second voltage during the self-refresh mode, wherein the detection signal generating step includes generating the detection signal based on the determinations of the first, second, and third determination steps.

13. The method according to claim 11, wherein the semiconductor memory device includes a sense amplifier for amplifying a read signal of stored data, and a sense amplifier activation power supply circuit connected to the sense amplifier for supplying the sense amplifier with current based on an activation signal that activates the sense amplifier, wherein the method further includes the step of:

supplying the internal circuit with the second voltage from the sense amplifier activation circuit based on the detection signal and the activation signal during the self-refresh mode.

14. The method according to claim 11, wherein the semiconductor memory device includes an activating power supply circuit that receives a device activation signal and is activated when the internal circuit is activated, the method further comprising the step of:

supplying the internal circuit with the second voltage from the active power supply circuit based on the detection signal and the device activation signal, which activates the semiconductor memory device.

15. A power supply circuit comprising:

a first power supply line for receiving an external power supply voltage;

a second power supply line for supplying an internal circuit with an internal power supply voltage;

a first transistor coupled between the first and second power supply lines for supplying a step down voltage to the second power supply line in a normal operation mode;

a second transistor coupled between the first and second power supply lines; and a detection circuit for outputting a detection signal upon a voltage drop on the external power supply voltage during a self refresh mode, wherein the first and second transistors are short-circuited between the first and second power supply lines in response to the detection signal.

* * * * *